United States Patent [19]

Necoechea

[11] Patent Number: 4,647,796
[45] Date of Patent: Mar. 3, 1987

[54] MULTIPLE LEVEL VOLTAGE COMPARATOR CIRCUIT

[75] Inventor: R. Warren Necoechea, Milpitas, Calif.

[73] Assignee: Fairchild Semiconductor Corporation, Cupertino, Calif.

[21] Appl. No.: 472,426

[22] Filed: Apr. 25, 1983

[51] Int. Cl.$^4$ .................... H03K 5/153; H03K 5/24
[52] U.S. Cl. .................................. 307/360; 307/362
[58] Field of Search ............... 307/360, 361, 362, 350, 307/355, 356; 328/115, 116, 146, 147, 148; 330/252, 299

[56] References Cited

U.S. PATENT DOCUMENTS 3,358,159 12/1967 Smith ................................. 307/360
4,456,840 6/1984 Ide et al. ........................... 307/362

Primary Examiner—John Zazworsky
Attorney, Agent, or Firm—Theodore S. Park; Bruce D. Riter; Robert C. Colwell

[57] ABSTRACT

A high speed voltage comparator circuit is disclosed which accepts a wide range of input potentials CBO1 and compares them with four potential levels CRH, CRL, CRIH, and CRIL. Each comparator includes input transistors Q103 and Q104, one of which is connected to the reference potential and the other is connected to the unknown potential. The emitters of the input transistors Q103 and Q104 are connected together through a resistor R105, and each emitter is connected to a current source, Q105 and Q107 respectively. A third current source Q106 is coupled to diodes D101 and D102 which are connected to the emitters of transistors Q103 and Q104 respectively. The difference between the reference potential and the unknown potential will forward bias one of the diodes and reverse bias the other. The resulting difference in emitter current between the input transistors Q103 and Q104 is detected by an output stage to indicate the relative magnitudes of the reference potential and the unknown potential.

28 Claims, 2 Drawing Figures

MULTIPLE LEVEL VOLTAGE COMPARATOR CIRCUIT

BACKGROUND OF THE INVENTION

1. Field of the Invention

This invention relates to circuits used for comparing voltages, and in particular to a voltage comparator circuit for use in the pin electronics circuits of automatic test equipment.

2. Description of the Prior Art

In automatic test equipment for the testing of integrated circuits, a plurality of pin electronics interface circuits are coupled to the pins or other nodes of an electronic device being tested. Through these pins, stimuli signals are supplied to the device under test, and output signals from the device under test are detected and measured. Usually, the stimuli signals represent logic states or analog voltages or currents which are desired to be impressed on the pins of the device under test as a parallel pattern, with the resulting output signals checked in parallel.

The interface circuits function as an interface between the computer controlling the test system and the individual pins of the device under test. The interface circuits receive reference voltages and digital data from other circuits in the test system, and then through a driving switch these voltages or data onto the desired pin of the device under test under control of a program stored in the test system computer. Correspondingly, the interface circuits receive reference voltages or data from the device under test and supply it to a comparator circuit which compares the signal received with the proper response stored in the program of the test system computer. In such apparatus voltage comparators are frequently used to determine the potential of one or more pins of the device being tested relative to one or more reference potentials.

As integrated circuits have increased in speed, size, and complexity, the demands made on the voltage comparators in automatic test equipment have correspondingly increased. With the advent of commercially available automatic test equipment operating from a 50 mega-Hertz clock signal, improved voltage comparators are necessary to enable testing of the device under test at these high clock rates.

In the prior art, high voltage comparators relied upon balanced differential pairs of field effect transistors for detecting the relative magnitude of a reference voltage with an unknown voltage. Unfortunately, such devices are not suitable for detecting failures of short duration such as those found when testing emitter coupled logic devices.

In other prior art voltage comparison circuits, fast low voltage comparators were feasible, but could not handle the voltage swings of TTL and MOS logic families. Typical prior art voltage comparators are shown in: "Sentry ® High Speed and Clock Driver Pin Electronics Reference Manual" available from Fairchild Test Systems Group, San Jose, California.

SUMMARY OF THE INVENTION

This invention provides a voltage comparator which, in the preferred embodiment, accepts a signal between minus four volts and plus seven volts and compares that signal to four independent reference potentials. Because the input devices remain in class A at all times, the circuit is fast, and the base-emitter breakdown of the input devices does not limit the differential input voltage. The circuit combines very high speed transistors with a wide voltage range capability. Because the input devices are always on, stored charge remains nearly constant and the change in propagation delay which accompanies overdriving is significantly reduced.

In a preferred embodiment a voltage comparator for comparing an unknown voltage relative to a reference voltage comprises first and second input transistors each having a first electrode for receiving a potential, the first electrode of the first transistor connected to a reference voltage and the first electrode of the second transistor connected to the unknown voltage, a second electrode of the first input transistor connected to a first current source, a second electrode of the second input transistor connected to a second current source; a third current source; first and second diodes each having a first electrode coupled to the third current source, the first diode having a second electrode connected to the second electrode of the first transistor, and a second diode having a second electrode coupled to the second electrode of the second transistor; and output detection means coupled to a third electrode of each of the first and second transistors for detecting which is being supplied current from the third current source.

In the preferred embodiment the voltage comparator circuit includes two independent voltage comparators, two dependent voltage comparators, and two temperature tracking networks to stabilize the operation of all comparators. To increase operating speed the diodes are preferably Schottky barrier diodes. In one embodiment a serially connected resistor and capacitor are connected between the second electrodes of the first and second transistors.

DETAILED DESCRIPTION OF THE PREFERRED EMBODIMENT

Figure 1:
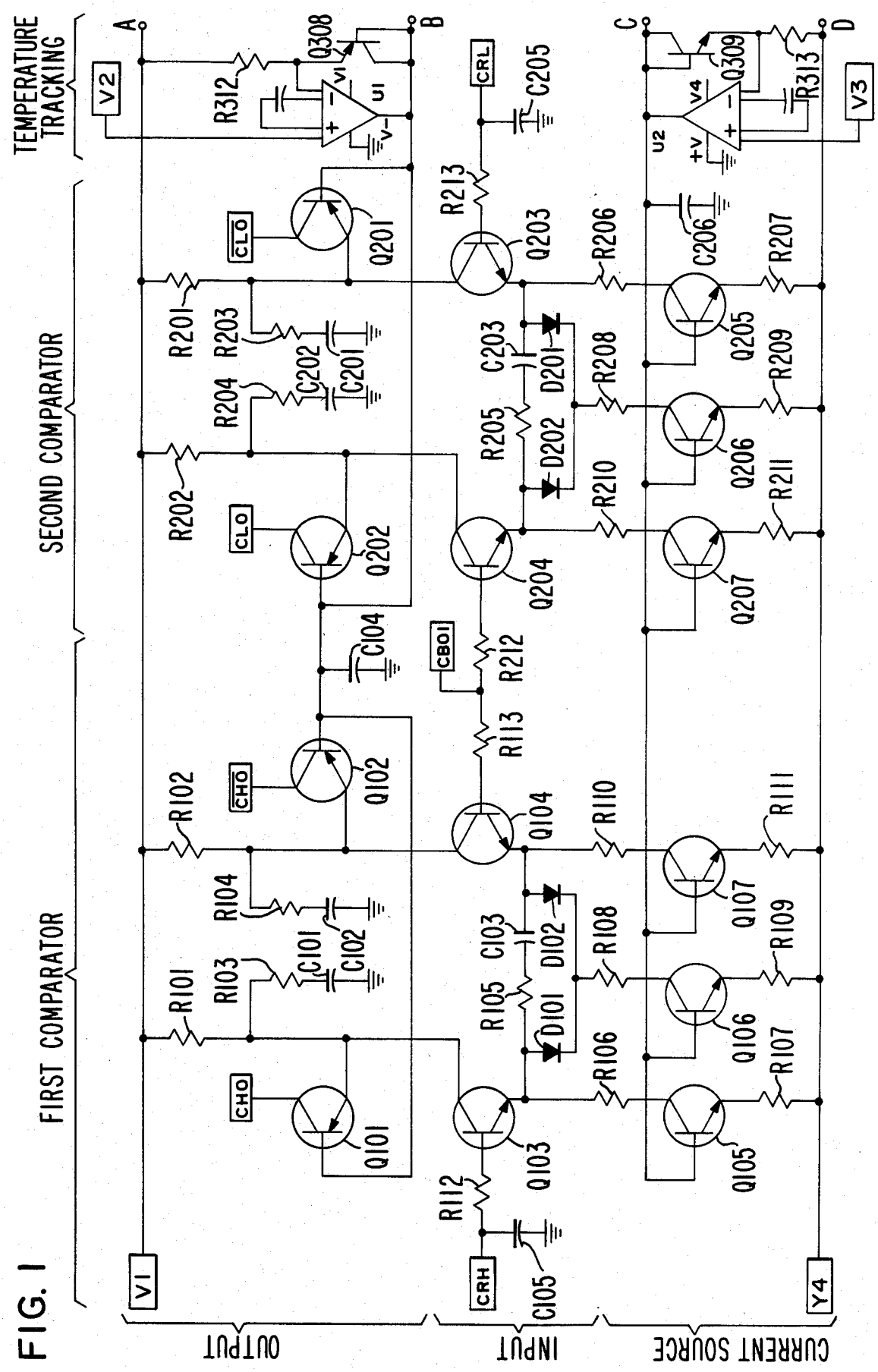
FIG. 1 is a schematic diagram of two independent voltage comparators for comparing the unknown voltage with a high and a low reference voltage.
Figure 2:
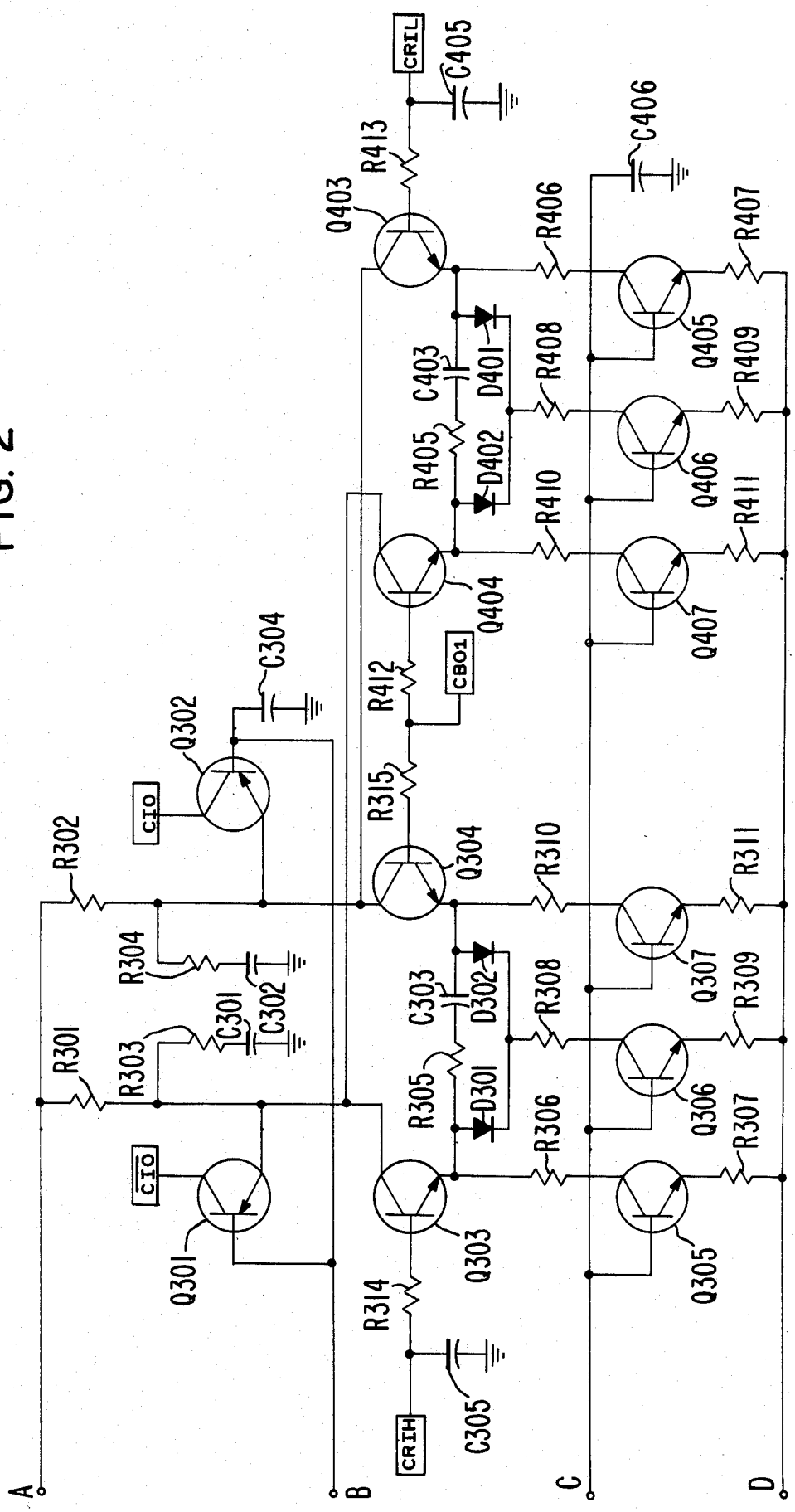
FIG. 2 is a schematic of two voltage comparator circuits coupled to the circuit shown in FIG. 1 for comparing the unknown voltage with two intermediate voltages.

FIGS. 1 and 2 are schematic drawings of the preferred embodiment of this invention. The circuits shown in FIGS. 1 and 2 are intended to be connected to each other at nodes A, B, C, and D as shown at the right-hand edge of FIG. 1 and the left—hand edge of FIG. 2.

The comparator circuits shown in FIGS. 1 and 2 accept an input signal CB01 and compare it to four different reference potentials - comparator reference high "CRH," comparator reference low "CRL," comparator reference intermediate high "CRIH," and comparator reference intermediate low "CRIL." Two of those potentials, CRH and CRL, have independent comparators associated with them designated first and second comparators in FIG. 1. The comparators associated with the CRIH and CRIL potential levels shown in FIG. 2 are coupled together to provide a single output signal indicative of whether the unknown potential is between the CRIH and CRIL potentials.

The inputs to the four comparators are divided to minimize loading on the buffer circuit typically used to supply the signal CB01 to the comparators. There are three differential output pairs, CHO and $\overline{\text{CHO}}$, CLO and $\overline{\text{CLO}}$, CIO and $\overline{\text{CIO}}$. These outputs are intended to drive hundred ohm loads, and be buffered by subsequent gain stages.

The structure of each of the four comparators shown in FIGS. 1 and 2 is similar. In the first comparator, transistors Q105, Q106 and Q107 have their bases connected to node C and emitters coupled through resistors R107, R109, and R111, respectively, to node D. The collector of each transistor is coupled through a corresponding resistor R106, R108 and R110. A differential pair of transistors consisting of transistors Q103 and Q104 have their emitters coupled together through resistor R105 and capacitor C103. Diode D101 is connected between the emitter of transistor Q103 and resistor R108, while diode D102 is connected between the emitter of transistor Q104 and resistor R108. A resistor R112 connects the comparator reference high potential CRH to the base of transistor Q103, while a similar resistor R113 connects the base of transistor Q104 and the source of signal CB01.

The collector outputs of the differential pair Q103 and Q104 are connected through resistances R101 and R102, respectively, to node A. A differential output pair consisting of transistors Q101 and Q102 have their bases shorted together. The emitter of transistor Q101 is connected to the collector of transistor Q103, while the emitter of transistor Q102 is connected to the collector of transistor Q104. The collector of Q101 supplies output signal CHO, while the collector of transistor Q102 supplies output signal $\overline{\text{CHO}}$. A compensation network consisting of resistor R103 and capacitor C101 is connected between ground and the emitter of transistor Q101, while a similar network consisting of resistor R104 and capacitor C102 is connected between ground and the emitter of transistor Q102.

The structure of the second comparator parallels that of the first comparator. The corresponding active and passive devices in the second comparator are numbered in the same manner as those in the first comparator except that the first digit of each reference numeral is "2" rather than "1." The bases of the differential input pair of the second comparator are connected between CB01 and the comparator reference low potential CRL.

A temperature tracking network includes an operational amplifier having input terminals connected to potential V2 and through resistor R312 to node A, and an output terminal connected to node B. A transistor Q308 has its emitter coupled to an input of amplifier U1, with collector and base shorted together to node B. In a similar manner a second temperature tracking network U2 has an operational amplifier having input terminals connected to potential V3 and through resistor R313 to node D, and an output terminal connected to node C. The corresponding transistor Q309 has its emitter coupled to node D through resistor R313, and its base and collector shorted to node C.

FIG. 2 depicts two further comparators, each constructed in the same manner as the first and second comparators illustrated in FIG. 1. The third comparator, shown generally on the left-hand side of FIG. 2, has components numbered to correspond with similar components in the first comparator, except that the first digit of each reference numeral for the parts of the third comparator is a "3", rather than a "1". The fourth comparator is also numbered with reference numerals corresponding to the first comparator except that the first digit of each reference numeral of the fourth comparator is a "4", rather than a "1". The base of transistor Q303 is coupled to an intermediate high comparator reference potential CRIH as shown, while the bases of transistors Q304 and Q404 are connected to CB01. Finally, the base of transistor Q403 is coupled to the comparator reference intermediate low potential CRIL. The collector electrodes of transistors Q303 and Q404 are connected together, as are the collectors of transistor Q304 and Q403. The common collectors of the pairs drive the differential output stage which includes transistors Q301 and Q302. Transistor Q301 has an emitter connected to the collectors of transistors Q303 and Q404, while the emitter of transistor Q302 is connected to the collectors of transistors Q304 and Q403. Transistors Q301 and Q302 supply output signals CIO and $\overline{\text{CIO}}$ as shown.

The operation of all four comparators is similar. With respect to the first comparator, transistors Q105, Q106, and Q107 function as current sources for the input differential transistor pair, Q103 and Q104. If the input potential CB01 is less than CRH, diode D101 will be forward biased and diode D102 reverse biased. The emitter current of transistor Q103 will therefore be the sum of the collector currents of transistors Q105 and Q106, while the emitter current of transistor Q104 will be the collector current of only transistor Q107. Because the voltage across resistors R101 and R102 will be substantially constant, any change in the collector current of transistor Q103 will result in an equal change in collector current for transistor Q101. Similarly a change in collector current for transistor Q104 results in an equal change for the collector current of transistor Q102. Because the emitter resistance of transistor Q101 is very small and is in parallel with resistor R101 almost all of the current change resulting from the input stage goes directly into changing the emitter current of the output stage.

Of particular advantage to this circuit is the fact that all transistors are always operating in the high $f_t$ range of their active region. The only devices which actually switch on and off are Schottky diodes D101 and D102, and these devices have recovery times on the order of less than 50 picoseconds.

Because the input transistors Q103 and Q104 operate in cascode with the output transistors Q101 and Q102, there is no feedback from output to input. Very high gains are also possible because the Miller capacitance of the input devices are not multiplied by the gain of the output stage. The circuit is also advantageous because its voltage range is limited only by the collector-emitter breakdown voltage of the input devices, typically on the order of 15 volts. Furthermore, because the input devices, transistors Q103 and Q104, are always on, their charge storage is nearly constant. The only change in charge storage results from the switching of the Schottky diodes D101 and D102, and the charge storage of these devices is relatively small, typically one-fifth that of the input transistors.

Resistors R103 and R104, and capacitors C101 and C102 provide a compensation network which avoids oscillation of the output stage at high frequencies. Capacitor C104 holds the base potential of transistor Q102 constant at high frequencies. The emitter potential of transistor Q102 is held constant at low frequencies by the output of operational amplifier U1. Capacitors C206 and operational amplifier U2 provide the same functions for transistors Q105, Q106, and Q107. Resistor R105 and capacitor C103 permit the use of slower transistors Q105, Q106, and Q107, and may be omitted if higher quality devices are employed.

Transistor Q308, operational amplifier U1 and resistor R312 form a temperature tracking network which maintains constant voltage across the emitter resistors of the output stages of both the first and second comparators. Transistor Q309, resistor R313, and operational amplifier U2 provide the same function for the emitter resistors R107, R109, and R111 of the current source transistors Q105, Q106 and Q107.

The circuits shown in FIG. 2 operate in the same manner as that described in conjunction with FIG. 1 except that the outputs of the comparators shown in FIG. 2 are combined to provide a single output signal CIO and its complement $\overline{CIO}$. In the preferred embodiment the resistances of R307, R309, and R311 (and R407, R409, and R411) are double the resistances of the corresponding resistors in FIG. 1 to thereby halve the current flow.

The two stages of comparators shown in FIG. 2 are summed together such that the collector currents of transistors Q303 and Q404 are maximized and the collector currents of transistors Q304 and Q403 are minimized, when the unknown potential CB01 is between potential CRIL and potential CRIH. Furthermore, resistances R301 and R302 are unequal so that the outputs CIO and $\overline{CIO}$ are equal when potential CRIH is greater than potential CB01 and when potential CB01 is greater than potential CRIL.

In the preferred embodiment the circuit shown in FIGS. 1 and 2 is fabricated using the component values and types shown below.

| Preferred Component Values and Types | | | |
|---|---|---|---|
| R101 | 234 ohms | C101 | 10 pf |
| R102 | 234 | C102 | 10 |
| R103 | 56 | C103 | 5 |
| R104 | 56 | C104 | .01 uf |
| R105 | 47 | C105 | .01 |
| R106 | 56 | C206 | .01 |
| R107 | 587 | Q101 | PNP |
| R108 | 56 | Q102 | PNP |
| R109 | 587 | Q103 | NPN |
| R110 | 56 | Q104 | NPN |
| R111 | 587* | Q105 | NPN |
| R112 | 50 | Q106 | NPN |
| R113 | 50 | Q107 | NPN |
| R301 | 218 | U1 | 741 |
| R302 | 267* | U2 | 741 |
| R307 | 1174 | V1 | 14.5 v |
| R309 | 1174 | V2 | 10.0 v |
| R311 | 1174 | V3 | −7.5 v |
| R312 | 1174 | V4 | −12.0 v |
| R313 | 1174 | | |
| R407 | 1174 | | |
| R409 | 1174 | | |
| R411 | 1174 | | |

*trimmable

Note: Components not specified correspond to those specified having the same last two digits of the reference numeral, i.e., R106, R206, R306, and R406 are each 56 ohms.

Using these component values and types the circuit shown in FIGS. 1 and 2 provides an input voltage range which allows CB01 to fluctuate between minus 4 volts and plus 7 volts. The comparator allows high speed operation over a wider voltage range than prior art comparators.

The foregoing description of the preferred embodiment of the invention is intended to illustrate the invention rather than limit it. The scope of the invention may be determined from the appended claims.

I claim:

1. A voltage comparator for comparing an unknown voltage to a reference voltage comprising:
   first and second input transistors, each having a first electrode for receiving a potential, the first electrode of the first input transistor being connected to the reference voltage and the first electrode of the second input transistor being connected to the unknown voltage;
   first and second current sources connected to a second electrode of the first and second input transistors, respectively;
   a first capacitive element and a first resistive element serially connected between the second electrodes of the first and second transistors;
   a third current source;
   first and second Schottky diodes each having a first electrode coupled to the third current source, the first diode having a second electrode connected to the second electrode of the first input transistor, and the second diode having a second electrode coupled to the second electrode of the second input transistor; and
   output detection means coupled to a third electrode of each of the first and second input transistors for detecting through which of said first and second transistors current from said third current source is flowing.

2. A voltage comparator for comparing an unknown voltage to a reference voltage comprising:
   first and second input transistors, each having a first electrode for receiving a potential, the first electrode of the first input transistor being connected to the reference voltage and the first electrode of the second input transistor being connected to the unknown voltage;
   first and second current sources connected to a second electrode of the first and second input transistors, respectively;
   a third current source;
   first and second diodes each having a first electrode coupled to the third current source, the first diode having a second electrode connected to the second electrode of the first input transistor, and the second diode having a second electrode coupled to the second electrode of the second input transistor; and
   first and second output transisors having first electrodes commonly connected, said output transistors being coupled to a third electrode of the first and second input transistors, respectively, for detecting through which of said first and second transistors current from said third current source is flowing.

3. A voltage comparator as in claim 2 wherein a second electrode of the first output transistor is connected to the third electrode of the first input transistor, and a second electrode of the second output transistor is connected to the third electrode of the second input transistor.

4. A voltage comparator as in claim 3 wherein the second electrode of each of the output transistors is connected through a corresponding one of a pair of second resistive elements to a first potential source.

5. A voltage comparator as in claim 4 wherein the first electrodes of the output transistors are coupled to a second potential source.

6. A voltage comparator as in claim 5 wherein a third electrode of each of the output transistors provides an output terminal.

7. A voltage comparator as in claim 6 wherein the second electrode of each of the output transistors is further connected to a corresponding compensation network.

8. A voltage comparator as in claim 7 wherein each compensation network comprises a serially connected third resistive element and a second capacitive element.

9. A voltage comparator as in claim 3 wherein each of the output transistors comprises a bipolar transistor having a base, a collector and an emitted.

10. A voltage comparator as in claim 9 wherein for each of the output transistors the first electrode comprises the base and the second electrode comprises the emitter.

11. A voltage comparator for comparing an unknown voltage to a reference voltage comprising:
  first and second input transistors, each having a first electrode for receiving a potential, the first electrode of the first input transistor being connected to the reference voltage and th first electrode of the second input transistor being connected to the unknown voltage;
  first and second current sources connected to a second electrode of each of the first and second input transistors, respectively, each of the first and second current sources comprising a transistor having a first electrode coupled to a first potential source and a second electrode coupled to a second potential source;
  a third current source;
  first and second diodes each having a first electrode coupled to the third current source, the first diode having a second electrode connected to the second electrode of the first input transistor, and the second diode having a second electrode coupled to the second electrode of the second input transistor; and
  output detection means coupled to a third electrode of each of the first and second input transistors for detecting through which of said first and second transistors current from said third current source is flowing, 12. A voltage comparator as in claim 11 wherein the first current source has a third electrode connected to the first input transistor and the second current source has a third electrode connected to the second input transistor.

13. A voltage comparator as in claim 12 wherein the third current source comprises a transistor having a first electrode coupled to said first potential source, a second electrode coupled to said second potential source and a third electrode connected to both the first and second diodes.

14. A voltage comparator for comparing an unknown voltage to a reference voltage comprising:
  first and second input transistors, each having a first electrode for receiving a potential, the first electrode of the first input transistor being connected to the reference voltage and the first electrode of the second input transistor being connected to the unknown voltage;
  first and second current sources connected to a second electrode of each of the first and second input transistors, respectively;
  a third current source;
  first and second diodes each having a first electrode coupled to the third current source, the first diode having a second electrode connected to the second electrode of the first input transistor, and the second diode having a second electrode coupled to the second electrode of the second input transistor;
  output detection means coupled to a third electrode of each of the first and second input transistors for detecting through which of said first and second transistors current from said third current source is flowing; and
  a first temperature tracking network connected to the output detection means.

15. A voltage comparator as in claim 14 further comprising a second temperature tracking network connected to each of the first, second and third current sources.

16. A voltage comparator as in claim 15 wherein the first temperature tracking network comprises an operational amplifier having a first input connected to the first potential, a second input connected a source of electrical signals, and an output connected to the second potential source.

17. A voltage comparator as in claim 16 wherein the second temperature tracking network comprises an operational amplifier having a first input connected to a fourth potential, a second input connected to a source of electrical signals, and an output connected to a third potential source.

18. First and second voltage comparators for comparing an unknown voltage to a reference voltage, each comparator comprising:
  first and second input transistors, each having a first electrode for receiving a potential, the first electrode of the first input transistor being connected to the reference voltage and the first electrode of the second input transistor being connected to the unknown voltage;
  first and second current sources connected to a second electrode of each of the first and second input transistors, respectively;
  a third current source;
  first and second diodes each having a first electrode coupled to the third current source, the first diode having a second electrode connected to the second electrode of the first input transistor, and the second diode having a second electrode coupled to the second electrode of the second input transistor; and
  output detection means coupled to a third electrode of each of the first and second input transistors for detecting through which of said first and second transistors current from said third current source is flowing;
  the first electrode of the second input transistor of the first voltage comparator being connected to the first electrode of the second input transistor of the second voltage comparator, and wherein the output detection means for the first voltage comparator is also the output detection means for the second voltage comparator, whereby an output signal is produced when said unknown voltage has a value between the values of the reference voltages for said first and second voltage comparators.

19. First and second voltage comparators as in claim 18 wherein the output detection means comprises first and second output transistors having commonly connected first electrodes.

20. First and second voltage comparators as in claim 19 wherein a second electrode of the first output transistor is connected to the third electrode of the first input transistor of each of said first and second voltage comparators, and a second electrode of the second output transistor is connected to the third electrode of the second input transistor of each of said first and second voltage comparators.

21. First and second voltage comparators as in claim 20 further comprising a first potential source, the second electrode of each of the output transistors being connected to said first potential source.

22. First and second voltage comparators as in claim 21 wherein the first electrodes of the output transistors are coupled to a second potential source.

23. First and second voltage comparators as in claim 22 wherein a third electrode of each of the output transistors providing an output terminal.

24. First and second voltage comparators as in claim 23 wherein the second electrode of each of the output transistors is further connected to a corresponding compensation network.

25. First and second voltage comparators, each as in claim 18, wherein:
the same unknown potential is applied to the first electrode of the second input transistor of each comparator; and
a different reference potential is applied to the first electrode of the first input transistor of the first voltage comparator than to the first electrode of the first input transistor of the second voltage comparator.

26. A voltage comparator for comparing an unknown voltage to a reference voltage comprising:

first and second input transistors, each having a first electrode for receiving a potential, the first electrode of the first input transistor being connected to the reference voltage and the first electrode of the second input transistor being connected to the unknown voltage;
first and second current sources connected to a second electrode of each of the first and second input transistors, respectively;
a third current source;
first and second diodes each having a first electrode coupled to the third current source, the first diode having a second electrode connected to the second electrode of the first input transistor, and the second diode having a second electrode coupled to the second electrode of the second input transistor; and
first and second output transistors having first electrodes commonly connected, a second electrode of said first output transistor being coupled to a third electrode of said first input transistor, a second electrode of said second output transistor being coupled to a third electrode of said second input transistor, a third electrode of said first output transistor forming a differential output with a third electrode of said second output transistor.

27. The voltage comparator of claim 26 further comprising a capacitor coupling said first electrodes of said output transistors to a ground potential.

28. The voltage comparator of claim 26 wherein each of said output transistors comprises a PNP bipolar transistor wherein said first electrode is a base, said second electrode is an emitter and said third electrode is a collector.

* * * * *